(12) United States Patent
Diekmann et al.

(10) Patent No.: US 10,326,098 B2
(45) Date of Patent: Jun. 18, 2019

(54) ORGANIC LIGHT-EMITTING DIODE HAVING A PLURALITY OF LIGHT-EMITTING SEGMENTS

(71) Applicant: OSRAM OLED GmbH, Regensburg (DE)

(72) Inventors: Karsten Diekmann, Rattenberg (DE); Andrew Ingle, Allershausen (DE); Jörg Farrnbacher, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 121 days.

(21) Appl. No.: 15/301,784

(22) PCT Filed: Mar. 31, 2015

(86) PCT No.: PCT/EP2015/057087
§ 371 (c)(1),
(2) Date: Oct. 4, 2016

(87) PCT Pub. No.: WO2015/155074
PCT Pub. Date: Oct. 15, 2015

(65) Prior Publication Data
US 2017/0149011 A1    May 25, 2017

(30) Foreign Application Priority Data

Apr. 8, 2014 (DE) .......... 10 2014 104 979

(51) Int. Cl.
*H01L 51/52* (2006.01)
*H01L 33/38* (2010.01)
(Continued)

(52) U.S. Cl.
CPC .......... *H01L 51/5209* (2013.01); *G09F 13/20* (2013.01); *G09F 13/22* (2013.01);
(Continued)

(58) Field of Classification Search
CPC .............. H01L 33/387; H01L 51/5206; H01L 51/5209; H01L 51/5221; H01L 51/5225;
(Continued)

(56) References Cited

U.S. PATENT DOCUMENTS

2014/0043571 A1* 2/2014 Chang .............. G02F 1/139
    349/123
2015/0340413 A1* 11/2015 Lee .............. G09G 3/3291
    257/40

(Continued)

FOREIGN PATENT DOCUMENTS

DE    1020060445294 A1    3/2008
DE    102013110666 A1    3/2015
(Continued)

*Primary Examiner* — Mohsen Ahmadi
*Assistant Examiner* — Christopher M Roland
(74) *Attorney, Agent, or Firm* — Slater Matsil, LLP

(57) ABSTRACT

An organic light-emitting diode is disclosed. In an embodiment, the diode includes a first light-emitting segment and at least a second light-emitting segment, wherein the first and second light-emitting segments include a common first electrode and a common second electrode, and are configured to emit radiation with different brightnesses, wherein the first electrode includes at least one separating line that does not completely cut through the first electrode, wherein an electric conductivity of the first electrode is reduced in a region of the separating line, wherein the separating line separates the first light-emitting segment from the second light-emitting segment, and wherein the second light-emitting segment has a lower brightness during operation than the first light-emitting segment.

15 Claims, 2 Drawing Sheets

(51) Int. Cl.

| | | |
|---|---|---|
| *G09F 13/22* | (2006.01) | |
| *H05B 33/26* | (2006.01) | |
| *G09F 13/20* | (2006.01) | |
| *H01L 27/32* | (2006.01) | |
| *H01L 51/50* | (2006.01) | |
| *H01L 51/10* | (2006.01) | |
| *H01L 51/44* | (2006.01) | |
| *G02F 1/1333* | (2006.01) | |
| *G02F 1/1343* | (2006.01) | |

(52) U.S. Cl.
CPC ........ *H01L 27/3239* (2013.01); *H01L 33/387* (2013.01); *H01L 51/5012* (2013.01); *H01L 51/5206* (2013.01); *H01L 51/5221* (2013.01); *H01L 51/5225* (2013.01); *H05B 33/26* (2013.01); *G02F 1/133377* (2013.01); *G02F 1/134327* (2013.01); *G02F 2001/133391* (2013.01); *G02F 2001/134318* (2013.01); *G02F 2001/134345* (2013.01); *H01L 27/3237* (2013.01); *H01L 27/3276* (2013.01); *H01L 27/3297* (2013.01); *H01L 51/102* (2013.01); *H01L 51/107* (2013.01); *H01L 51/441* (2013.01); *H01L 51/442* (2013.01); *H01L 51/50* (2013.01)

(58) Field of Classification Search
CPC ............. H01L 27/3237; H01L 27/3239; H01L 27/3276; H01L 27/3279; H01L 27/3297; H01L 51/50; H01L 51/102; H01L 51/107; H01L 51/441; H01L 51/442; H01L 51/5278; H05B 33/26; G09F 13/20; G09F 13/22; G02F 1/133377; G02F 1/134327; G02F 2001/133391; G02F 2001/134318; G02F 2001/134345
USPC ............................................ 40/544; 313/510
See application file for complete search history.

(56) References Cited

U.S. PATENT DOCUMENTS

2016/0233276 A1    8/2016    Ingle
2017/0358747 A1*  12/2017   Hartinger ............ H01L 51/0023

FOREIGN PATENT DOCUMENTS

| GB | 2437113 A | | 10/2007 |
|---|---|---|---|
| JP | 2005285523 A | * | 10/2005 |
| JP | 200948808 A | | 3/2009 |
| WO | 2004084324 A1 | | 9/2004 |
| WO | 2007004121 A2 | | 1/2007 |
| WO | 2011007296 A1 | | 1/2011 |

* cited by examiner

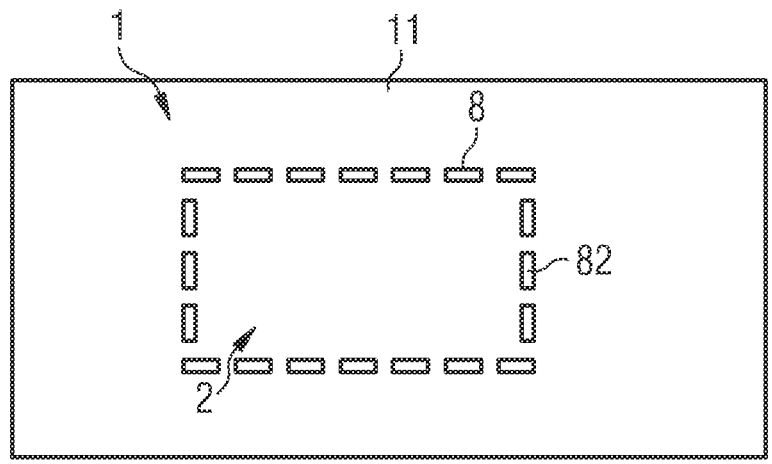
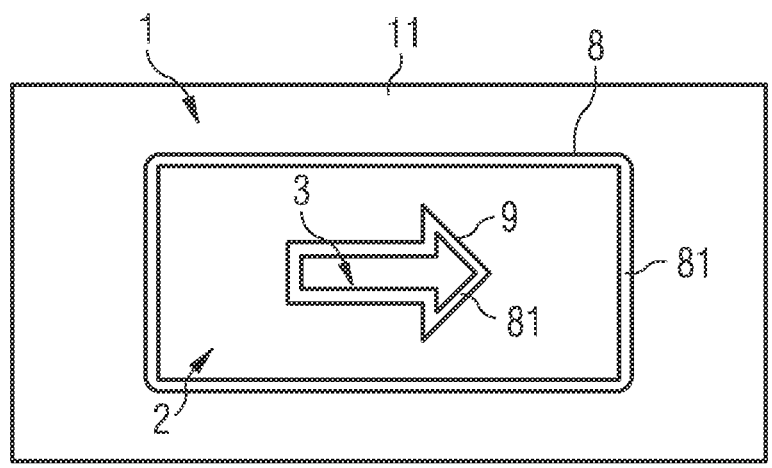

ORGANIC LIGHT-EMITTING DIODE HAVING A PLURALITY OF LIGHT-EMITTING SEGMENTS

This patent application is a national phase filing under section 371 of PCT/EP2015/057087, filed Mar. 31, 2015, which claims the priority of German patent application 10 2014 104 979.9, filed Apr. 8, 2014, each of which is incorporated herein by reference in its entirety.

TECHNICAL FIELD

The invention relates to an organic light-emitting diode comprising multiple light-emitting segments, wherein said multiple light-emitting segments are provided for emitting radiation with different brightnesses.

BACKGROUND

This patent application claims the priority of German patent application 10 2014 104 979.9, the disclosure of which is incorporated herein by reference.

An organic light-emitting diode that comprises multiple light-emitting segments with different brightnesses can be realized in that the multiple segments are provided with separate electrodes which can be operated via separate supply lines with different currents. Separate contacting of the segments increases manufacturing efforts compared to a non-segmented organic light-emitting diode. Furthermore, distance between the segments cannot be reduced in an arbitrary manner due to the supply lines being guided between the segments.

SUMMARY OF THE INVENTION

Embodiments of the invention provide an improved organic light-emitting diode having multiple light-emitting segments that can be manufactured in a comparatively simple manner and that enables a small distance between neighboring light-emitting segments.

According to at least one embodiment, the organic light-emitting diode comprises a first light-emitting segment and at least a second light-emitting segment, wherein the light-emitting segments are provided for emitting radiation with different brightnesses. The first light-emitting segment and the second light-emitting segment have a common first electrode and a common second electrode. For example, the first electrode may be the anode and the second electrode may be the cathode of the organic light-emitting diode. As an alternative, the first electrode may be the cathode and the second electrode may be the anode.

In the light-emitting diode, the first electrode advantageously comprises at least one separating line, wherein an electric conductivity of the first electrode is reduced in the region of the separating line. The separating line separates the second light-emitting segment from the first light-emitting segment, wherein the second light-emitting segment has a lower brightness than the first light-emitting segment during operation.

Advantageously, the first electrode is not completely cut through by the separating line. The separating line is rather designed such that the electric conductivity is actually reduced in the region of the separating line, but that there is still an electrically-conductive connection between a region of the first electrode in the first light-emitting segment and a region of the first electrode in the second light-emitting segment. Advantageously, the first electrode serves as a first electrode for both the first light-emitting segment and the second light-emitting segment. An incomplete cut through the first electrode by the separation line may particularly mean that a thickness of the first electrode along the separating line is reduced or that the first electrode is interrupted in places by cut-outs along the separating line.

In the organic light-emitting diode described herein, a reduced brightness of the second light-emitting segment compared to the first light-emitting segment is achieved in that the current flow through the second light-emitting segment is reduced due to the reduced electric conductivity of the separating line that separates the second light-emitting segment from the first light-emitting segment. Thus, advantageously, no separate supply line for connecting the second light-emitting segment to a current or voltage supply is required for operating the second light-emitting segment with reduced brightness. The different brightnesses of the first light-emitting segment and of the second light-emitting segment rather result from a structure in the common first electrode formed by the separating line. Since no separate supply lines are required for the second light-emitting segment, the first light-emitting segment and the second light-emitting segment may have a comparatively low distance to one another. In particular, the distance between the first light-emitting segment and the second light-emitting segment may correspond to the width of the separating line.

In the organic light-emitting diode, the first electrode and the second electrode advantageously each comprise one single connection contact for connecting the organic light-emitting diode to a current or voltage source.

According to at least one embodiment, an electric connection contact of the first electrode adjoins the first light-emitting segment. In other words, the first electrode structured with the separating line is provided with a connection contact in the region of the first light-emitting segment, which has the greater brightness. The first electrode is advantageously connected to a current or voltage source on the electric connection contact. The second light-emitting segment, which is separated from the first light-emitting segment by the separating line, does not have a separate electric connection contact of the first electrode. The region of the first electrode is rather connected to the current or voltage source in the second light-emitting segment preferably exclusively via the region of the first electrode in the first light-emitting segment and the connection contact adjoining thereon.

Advantageously, the second electrode is not structured and likewise has only one single connection contact for connection to the current or voltage source.

According to at least one embodiment, the at least one separating line is formed by a line-shaped depression in the first electrode. In this case, the first electrode has a smaller thickness along the separating line than external to the separating line. For example, the thickness of the first electrode can be reduced along the separating line by at least 25%, at least 50% or at least 75%.

As a result of the reduced thickness of the first electrode in the region of the separating line, the electric conductivity is reduced in the region of the separating line.

In another preferred embodiment, the at least one separating line is formed by a line-shaped arrangement of cut-outs in the first electrode. In said configuration, in other words, the electrode is perforated along the separating line so that an electric connection between the region of the first light-emitting segment and the region of the second light-emitting segment only exists in the regions of the first electrode arranged between the cut-outs in the region of the separating layer.

The line-shaped depression or the line-shaped arrangement of cut-outs in the first electrode is preferably produced by laser ablation or by an etching process, in particular a photolithographic etching process.

According to at least one embodiment, the separating line encircles the second light-emitting segment entirely. In said configuration, the second light-emitting segment is arranged entirely inside the first light-emitting segment. This way, a second light-emitting segment having a predetermined second brightness can advantageously be generated within a first light-emitting segment having a first predetermined brightness.

According to another embodiment, the first electrode comprises at least one further separating line in the second light-emitting segment, said separating line separating a third light-emitting segment from the second light-emitting segment, wherein the third light-emitting segment has a lower brightness during operation than the second light-emitting segment. In terms of the advantageous configuration of the further separating line, said further separating line is designed as the above-described separating line between the first light-emitting segment and the second light-emitting segment. In particular, the further separating line may entirely encircle the third light-emitting segment so that the third light-emitting segment is entirely arranged within the second light-emitting segment.

Due to the fact that the first electrode has a reduced electric conductivity in the region of the further separating line, the current flow through the third light-emitting segment being separated from the second light-emitting segment by the further separating line is even smaller than in the second light-emitting segment. In this configuration, the organic light-emitting diode is thus characterized by at least three different brightnesses in the light-emitting segments.

It is possible to insert even another separating line in the third light-emitting segment in order to separate a fourth light-emitting segment with an even further reduced brightness from the third light-emitting segment. The proposed principle, in which a light-emitting segment having reduced brightness is separated from a surrounding light-emitting segment having a greater brightness by the insertion of a separating line with reduced electric conductivity, can be continued step by step in order to achieve multiple brightness levels in the organic light-emitting diode. The multiple light-emitting segments can advantageously be supplied with current by one common current supply despite the different brightness levels, the connection point of said current supply being arranged on the light-emitting segment that has the greatest brightness. Thus, in particular, separate supply lines for the light-emitting segments having the different brightnesses are not required.

According to an advantageous embodiment, the first electrode is arranged on a substrate of the organic light-emitting diode, and an organic layer stack, which comprises a light-emitting active layer, is arranged on the first electrode. In particular, the first electrode may form the anode of the organic light-emitting diode and be arranged on a glass substrate, for example.

The second electrode of the organic light-emitting diode is advantageously arranged on a side of the organic layer stack opposite the first electrode and may particularly be the cathode of the organic light-emitting diode. Advantageously, the second electrode is not structured, since the different currents are adjusted by the light-emitting segments by means of the structure of the first electrode. Advantageously, just like the first electrode, the second electrode has only one single connection contact for connection to a current or voltage source. The organic light-emitting diode can therefore be connected to a current or voltage source via only two supply lines that lead to the connection contacts on the first electrode and the second electrode.

The organic light-emitting diode may be designed as a so-called bottom-emitter that emits radiation through a transparent substrate. As an alternative, the organic light-emitting diode may be an organic light-emitting diode that emits on both sides when in particular both the first electrode and the second electrode have a transparent design. Depending on the configuration of the electrodes as being transparent or reflecting and/or the insertion of a reflection layer, the organic light-emitting diode may be designed as a top-emitter, bottom-emitter or organic light-emitting diode emitting on both sides.

According to an advantageous embodiment, the at least one separation line in the first electrode is covered with an electrically insulating layer. This provides the advantage that the region produced by the separating line and having the reduced electric conductivity is not short-circuited by an electrically conductive layer arranged on top thereof, in particular not by a layer of the organic layer stack of the light-emitting diode. In this configuration, the electrically insulating layer advantageously has a structure approximately of the same structure as the separating line so that it covers essentially only the separating line but not the remaining regions of the first electrode. The electrically insulating layer is preferably a transparent polymer layer.

According to at least one embodiment, at least one of the light-emitting segments forms a graphic element. The graphic element may particularly constitute an image, a symbol or at least one character. In this case, the separating line produced in the first electrode forms the outer circumference of the graphic element.

According to at least one embodiment, the separating line has a width of between 25 μm and 100 μm. The brightness difference between the light-emitting segments separated by the separating line can be adjusted by adjusting the width of the separating line in a targeted manner.

Preferably, the first electrode is a transparent electrode. In particular, the first electrode may comprise a transparent conductive oxide (TCO). Transparent conductive oxides are transparent conductive materials, usually metal oxides such as zinc oxide, tin oxide, cadmium oxide, titanium oxide, indium oxide or indium tin oxide (ITO).

BRIEF DESCRIPTION OF THE DRAWINGS

Hereinafter, the invention will be described in more detail by means of exemplary embodiments in conjunction with FIGS. 1 to 3.

The Figures show in:

FIG. 2 a schematic illustration of a plan view of the first electrode of the organic light-emitting diode according to a second exemplary embodiment; and FIG. 3 a schematic illustration of a plan view of the first electrode of an organic light-emitting diode according to a third exemplary embodiment.

Like or equivalent elements are indicated in the Figures each with the same reference numeral. The illustrated components as well as size ratios of said components amongst one another are not to be considered as being to scale.

DETAILED DESCRIPTION OF ILLUSTRATIVE EMBODIMENTS

Figure 1A:
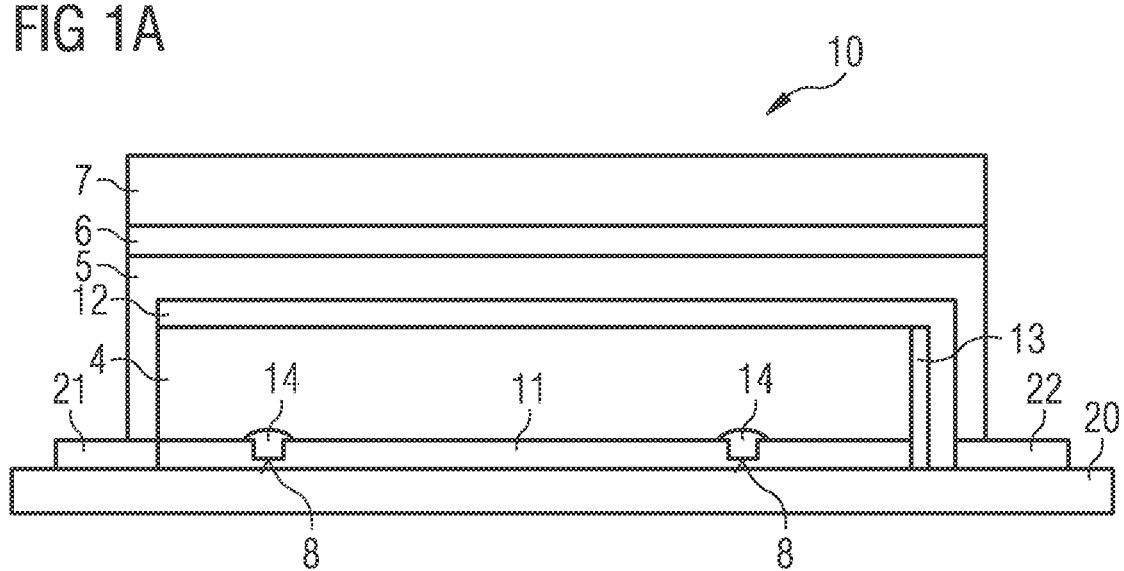
FIG. 1A a schematic illustration of a cross-section through an organic light-emitting diode according to a first exemplary embodiment.
Figure 1B:
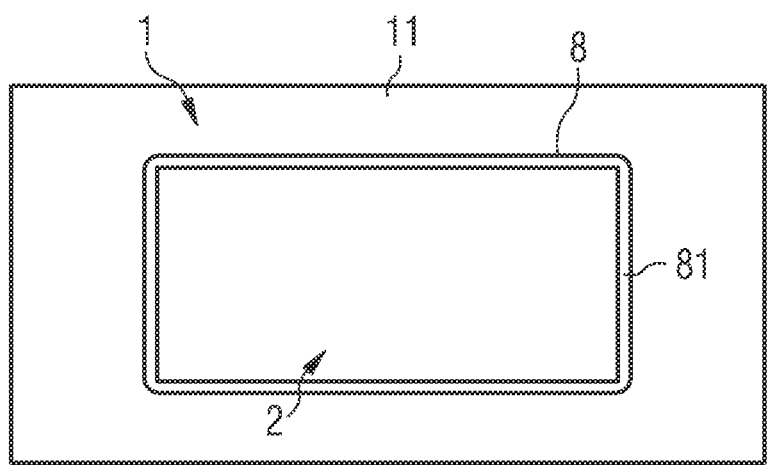
FIG. 1B a schematic illustration of a plan view of the first electrode of the organic light-emitting diode according to the first exemplary embodiment.

The organic light-emitting diode 10 according to the first exemplary embodiment, of which FIG. 1A shows a cross-section and FIG. 1B a plan view of the first electrode, comprises an organic layer stack 4, which is arranged between a first electrode 11 and a second electrode 12. The first electrode 11 and the second electrode 12 are isolated from one another by an electrically insulating layer 13 in this exemplary embodiment.

The organic layer stack 4 is formed by a layer sequence suitable for emitting radiation, the sub-layers of which are not illustrated for the sake of clarity. In particular, the organic layer stack 4 comprises at least one organic electroluminescent active layer. The organic functional layer stack 4 may furthermore comprise a hole injection layer, a hole transport layer, an electron blocking layer, a hole blocking layer, an electron transport layer and/or an electron injection layer, for example, which are suitable for conducting holes or electrons to the organic electroluminescent layer or for blocking the respective transport. Suitable layer arrangements and materials for organic light-emitting diodes are known per se and will therefore not be explained in further detail.

The organic light-emitting diode 10 comprises, in this exemplary embodiment, a substrate 20, which may be a transparent or translucent substrate 20 such as a glass substrate or a polymer substrate. Preferably, electromagnetic radiation exits on the side of the substrate 20 facing away from the first electrode 11. Optionally, the side of the substrate 20 facing away from the first electrode 11 may be mirrored. Optionally or additionally, electromagnetic radiation may exit on the side of the second electrode 12 facing away from the substrate 20. In this case, the second electrode 12 is preferably transparent or translucent. The organic light-emitting diode 10 can thus be a top-emitter or a bottom-emitter or emit electromagnetic radiation in both directions.

The substrate 20 is followed by the first electrode 11, the organic layer stack 4 and the second electrode 12. In the exemplary embodiment, the first electrode 11 can be connected to a current or voltage source via a connection contact 21 and the second electrode can be connected to a current or voltage source via a connection contact 22.

For protecting the organic layer stack 4 and the electrodes 11, 12 against external impacts, in particular for protection against the penetration of moisture and/or against oxidation, the organic light-emitting diode 10 may comprise a thin film encapsulation 5, which is formed of one or multiple oxide, nitride or oxinitride layers. Suitable materials for the layers of the thin film encapsulation are, for example, aluminum oxide, zinc oxide, zirconium oxide, titanium oxide, hafnium oxide, lanthanum oxide or tantalum oxide. Preferably, the encapsulation has a layer sequence with a multitude of thin layers, said layers each having a thickness between one atomic layer and several 100 nm. Furthermore, the organic light-emitting diode can be connected with an adhesive layer 6 with a covering glass 7 on a side facing away from the substrate 20, for example.

The organic light-emitting diode 10 radiates in a first light-emitting segment 1 radiation with a first brightness and in a second light-emitting segment 2 radiation with a lower second brightness during operation. Advantageously, in the organic light-emitting diode 10, this is achieved by a structuring of the first electrode 11. As can be seen in the plan view of the electrode 11 illustrated in FIG. 1B, the first light-emitting segment 1 and the second light-emitting segment 2 are defined by a separating line 8 in the first electrode 11. The first light-emitting segment 1 is defined by the region of the first electrode 11 external to the separating line 8 and the second light-emitting segment is defined by the region of the first electrode 11 within the separating line 8. The second light-emitting segment 2 is advantageously entirely encircled by the separating line 8. In the exemplary embodiment, the separating line 8 has the shape of a rectangle. As an alternative, the separating line 8 may have a different shape depending on the desired shape of the second light-emitting segment 2.

As can be seen in the cross-sectional illustration of FIG. 1A, the separating line 8 can particularly be a line-shaped depression 81 in the first electrode 11. In the exemplary embodiment, the separating line 8 forms a rectangular contour of the second light-emitting segment 2. The separating line 8 may alternatively also have another arbitrary contour, in particular the contour of a logo, a symbol or a character.

Due to the fact that the separating line 8 is formed by a depression 81 in the first electrode 11, the electric conductivity of the first electrode 11 is reduced in the region of the separating line 8. This achieves that the current flow through the second light-emitting segment 2 is reduced compared to the first light-emitting segment 1 during operation of the organic light-emitting diode 10. During operation, the second light-emitting segment 2 thus radiates radiation with a lower brightness than the first light-emitting segment 1. Separate connection contacts for the first light-emitting segment 1 and the second light-emitting segment 2 are advantageously not required for achieving the different brightnesses in the light-emitting segments 1, 2.

The first electrode 11 rather comprises one single connection contact 21 and the second electrode 12 comprises one single connection contact 22. The connection contact 21 of the first electrode 11 adjoins the first light-emitting segment 1, which is provided for emitting radiation with the greater brightness. The second light-emitting segment 2 is also electrically conductively connected to the first connection contact 21 via the first light-emitting segment 1 and the region of the reduced electric conductivity of the separating line 8. A separate supply line for the second light-emitting segment 2 is thus not required.

The current flow through the second light-emitting segment 2 and the resulting brightness can particularly be adjusted by width of the depression 81 and/or the depth of the depression 81. For example, the width of the depression 81 can be between 25 μm and 100 μm. The thickness of the first electrode 11 in the region of the separating line 8 can be reduced by at least 25%, at least 50% or even by at least 75% compared to the adjoining regions of the light-emitting segments 1, 2. External to the separating line 8, the first electrode advantageously has a constant thickness, i.e. the thickness of the first electrode 11 does not differ in the first light-emitting segment 1 and the second light-emitting segment 2. Apart from the manufacture of the separating line 8, the first electrode 11 may thus advantageously be applied by a conventional coating process. External to the separating line, the thickness of first electrode 11 may be between 20 nm and 1 μm, preferably between 100 nm and 200 nm, for example.

The depression 81 for generating the separating line 8 can be generated by laser ablation, for example. Here, the diameter of the laser beam is preferably between 25 µm and 100 µm, particularly preferably 60 µm or less. Here, the diameter of the laser beam corresponds essentially to the line width of the separating line. The laser may be a diode-pumped solid state laser. The laser may generate laser radiation in the UV-range, for example having a wavelength of 370 nm. The power of the laser can be between 1 W and 4 W, for example.

Optionally or additionally, manufacture of the separating line 8 may comprise the at least partial removal of the first electrode 11 by etching. Said etching may be wet chemical etching, in particular photo-chemical etching with a mixture of nitric acid and iron (III) chloride. Optionally or additionally, said etching may comprise dry etching, in particular plasma etching. Compared to laser ablation, etching provides the advantage that preventing damage to the glass substrate is easier.

The first electrode 11 may particularly be the anode of the organic light-emitting diode 10. Preferably, the first electrode 11 is a transparent electrode, which comprises a transparent conductive oxide, for example. Preferably, the first electrode 11 comprises ITO. The second electrode 12 arranged on the opposite side of the organic layer stack 4 may be a thin metal layer, for example.

The depression 81, which forms the separating line 8, is preferably electrically insulated from the organic layer sequence 4 by an electrically insulating layer 14. This provides the advantage that the region of reduced electric conductivity is not short-circuited by an adjoining layer of the organic layer sequence 4, whereby the effect of the reduced electric conductivity would be reduced.

FIG. 2 shows a plan view of an alternative embodiment of the first electrode 11 in a further exemplary embodiment. In this exemplary embodiment, the first electrode 11 is not formed by a depression but by a line-shaped arrangement of cut-outs 82 in the first electrode 11. The first electrode can be removed all the way to the surface of the substrate in the cut-outs 82. The contour of the second light-emitting segment 2, which is formed by the separating line 8, is rectangular, just like in the first exemplary embodiment. The electric conductivity is reduced in the region of the separating line 8 due to the cut-outs 82 in the first electrode 11.

For example, the cut-outs 82 can be produced in the first electrode 11 by means of laser ablation or by means of an etching process, just like the above-described depression. Furthermore, the cut-outs 82 can be covered with an electrically insulating layer, just like the depressions of the first exemplary embodiment. Apart from that, the structure of the organic light-emitting diode and further advantageous configurations correspond to the first exemplary embodiment.

FIG. 3 shows yet another embodiment of the first electrode 11 in a third exemplary embodiment of the organic light-emitting diode. In this exemplary embodiment, the organic light-emitting diode 10 comprises a first light-emitting segment 1, a second light-emitting segment 2 and a third light-emitting segment 3. Just like in the first exemplary embodiment, the second light-emitting segment 2 is separated from the first light-emitting segment 1 by a rectangular separating line 8 which is formed by a depression in the first electrode 11.

In the third exemplary embodiment, a further separating line 9 is additionally arranged in the first electrode 11 within the second light-emitting segment 2, which further separating line 9 may be formed by a depression 81 just like the first separating line 8. The further separating line 9 may have the same configurations as the previously-described separating line 8 between the first light-emitting segment 1 and the second light-emitting segment 2. The depressions 81, which form the separating line 8 and the further separating line 9, may be covered with an electrically insulating layer, just like the depressions of the first exemplary embodiment.

The further separating line 9 separates a third light-emitting segment 3 from the second light-emitting segment 2, with the current flow through the third light-emitting segment 3 being even further reduced compared to the second light-emitting segment 2 due to the reduced electric conductivity in the region of the further separating line 9.

In the exemplary embodiment, the further separating line 9 has the shape of a graphic symbol in the shape of an arrow. In this case, the organic light-emitting diode can be used as an information sign that indicates a direction, for example. As an alternative, by means of another design of the separating lines 8, 9, any other graphic symbol, a logo or a writing can be illustrated by the organic light-emitting diode.

Just like in the second exemplary embodiment the further separating line 9 could be formed by a line-shaped arrangement of cut-outs in the first electrode 11 instead of by a depression 81, like the separating line of the above-described second exemplary embodiment.

Furthermore, it is possible to provide one or multiple further separating lines in order to generate further segments of even lower brightness (not shown). By inserting a separating line 8, 9 into a light-emitting segment 1, 2, 3 of a predetermined brightness, in each case one enclosed light-emitting segment of a lower brightness can be generated. This principle can be repeated multiple times so that a plurality of light-emitting segments can be generated with a brightness decreasing step by step. Just like the second light-emitting segment 2, no separate current supply is required for the third light-emitting segment 3. The distance between the light-emitting segments 1, 2, 3 may thus advantageously be very low and particularly merely correspond to the width of the separating lines 8, 9.

The invention is not limited by the description by means of the exemplary embodiments. The invention rather comprises any new feature as well as any combination of features, particularly including any combination of features in the patent claims, even if said feature or said combination per se is not explicitly indicated in the patent claims or exemplary embodiments.

The invention claimed is:

1. An organic light-emitting diode comprising:
   a first light-emitting segment; and
   at least a second light-emitting segment,
   wherein the first and second light-emitting segments comprise a common first electrode and a common second electrode, and are configured to emit radiation with different brightnesses,
   wherein the first electrode comprises at least one separating line,
   wherein the at least one separating line comprises a line-shaped depression in the first electrode, or a line-shaped arrangement of cut-outs in the first electrode,
   wherein an electric conductivity of the first electrode is reduced in a region of the at least one separating line,
   wherein the at least one separating line separates the first light-emitting segment from the second light-emitting segment,
   wherein the second light-emitting segment has a lower brightness during operation than the first light-emitting segment, and wherein, external to the at least one separating line, a thickness of the first electrode does not differ in the first light emitting segment and the second light emitting segment.

2. The organic light-emitting diode according to claim 1, wherein each of the first and second electrodes has a single connection contact for connecting the organic light-emitting diode to a current or voltage source.

3. The organic light-emitting diode according to claim 1, wherein an electric connection contact of the first electrode adjoins the first light-emitting segment.

4. The organic light-emitting diode according to claim 1, wherein the at least one separating line entirely encircles the second light-emitting segment.

5. The organic light-emitting diode according to claim 1, wherein the first electrode comprises at least one further separating line in the second light-emitting segment, the at least one further separating line separating a third light-emitting segment from the second light-emitting segment, wherein the third light-emitting segment has a lower brightness during the operation than the second light-emitting segment.

6. The organic light-emitting diode according to claim 5, wherein the at least one further separating line entirely encircles the third light-emitting segment.

7. The organic light-emitting diode according to claim 5, wherein the at least one further separating line is produced by laser ablation or by an etching process.

8. The organic light-emitting diode according to claim 1, wherein the first electrode is arranged on a substrate of the organic light-emitting diode, and an organic layer stack comprising a light-emitting active layer is arranged on the first electrode.

9. The organic light-emitting diode according to claim 1, wherein the at least one separating line is covered with an electrically insulating layer.

10. The organic light-emitting diode according to claim 1, wherein at least one of the first and second light-emitting segments forms a graphic element.

11. The organic light-emitting diode according to claim 10, wherein the graphic element is an image, a symbol or a character.

12. The organic light-emitting diode according to claim 1, wherein the at least one separating line has a width between 25 μm and 100 μm.

13. The organic light-emitting diode according to claim 1, wherein the at least one separating line is produced by laser ablation or by an etching process.

14. The organic light-emitting diode according to claim 1, wherein the first electrode is a transparent electrode.

15. An organic light-emitting diode comprising:
a first light-emitting segment; and
at least a second light-emitting segment, wherein the first and second light-emitting segments comprise a common first electrode and a common second electrode, and are configured to emit radiation with different brightnesses,
wherein the first electrode comprises at least one separating line,
wherein the at least one separating line comprises a line-shaped depression in the first electrode, or a line-shaped arrangement of cut-outs in the first electrode,
wherein an electric conductivity of the first electrode is reduced in a region of the at least one separating line,
wherein the at least one separating line separates the first light-emitting segment from the second light-emitting segment,
wherein the second light-emitting segment has a lower brightness during operation than the first light-emitting segment,
wherein the at least one separating line entirely encircles the second light-emitting segment, and
wherein, external to the at least one separating line, a thickness of the first electrode does not differ in the first light emitting segment and the second light emitting segment.

* * * * *